United States Patent [19]

Molina et al.

[11] Patent Number: 4,904,951
[45] Date of Patent: Feb. 27, 1990

[54] METHOD AND CIRCUIT FOR REDUCING EFFECTS OF DISTRIBUTED CAPACITANCE ASSOCIATED WITH LARGE THIN FILM RESISTORS

[75] Inventors: Johnnie F. Molina; Robert M. Stitt, II, both of Tucson, Ariz.

[73] Assignee: Burr-Brown Corporation, Tucson, Ariz.

[21] Appl. No.: 203,250

[22] Filed: Jun. 6, 1988

[51] Int. Cl.⁴ .............................................. H03F 1/36
[52] U.S. Cl. ..................................... 330/107; 330/76; 330/307
[58] Field of Search .................. 307/262; 330/76, 107, 330/109, 252, 258, 286, 292, 294, 307

[56] References Cited
U.S. PATENT DOCUMENTS 4,118,672 10/1978 Noguchi ............................. 330/286
4,338,571 7/1982 Young ............................. 330/107 X Primary Examiner—Steven Mottola
Attorney, Agent, or Firm—Cahill, Sutton & Thomas

[57] ABSTRACT

A technique for reducing phase shift of a signal passing through a large thin film resistor on an insulating layer includes applying a signal to one terminal of the thin film resistor and also to one end of an underlying doped epitaxial region. The opposite terminal of the thin film resistor is connected to a virtual ground or virtual reference voltage produced by an inverting input of an operational amplifier. The corresponding opposite end of the epitaxial layer is connected to ground or other reference voltage. The voltage gradients produced by currents flowing through both the thin film resistor and the epitaxial layer are equal, so that substantially no incremental charging current flows through capacitance between the thin film resistor and the epitaxial layer. Phase shift of the signal flowing through the thin film resistor is thereby avoided.

11 Claims, 3 Drawing Sheets

METHOD AND CIRCUIT FOR REDUCING EFFECTS OF DISTRIBUTED CAPACITANCE ASSOCIATED WITH LARGE THIN FILM RESISTORS

BACKGROUND OF THE INVENTION

In many integrated circuits the effects of distributed capacitance between a thin film resistor and the underlying silicon substrate are not a critical factor in achieving desired circuit performance because the thin film resistor is not physically so large that an RC time constant formed by its resistance and associated parasitic capacitance introduces signal phase shifts that prevent desired circuit performance from being achieved. Thin film resistors and diffused resistors having resistances of over about 100 kilohms consume a great deal of surface area of an integrated circuit. Consequently, integrated circuit designers traditionally have avoided design of circuits requiring such large resistances. For example, use of physically large thin film resistors (with large associated parasitic capacitances) ordinarily would be avoided in an amplifier feedback path wherein substantial phase shifts would be expected to produce significant design problems, such as lowering gain margin and phase margin, possibly causing significant signal overshoot and "ringing", and possibly even resulting in sustained undesired oscillations, (which occur if the amplifier gain exceeds unity when the phase shift is 180 degrees). Other reasons for avoiding physically large resistors in an integrated circuit include a disproportionately large increase in chip cost that results when physically large resistors are to be included on the chip.

There are many electronic applications for amplifiers in which the amplifier input must be "isolated" from the amplifier output so that large common mode input signals (of several hundred volts to several thousand volts) do not produce a corresponding common mode output voltage; that is, only the incremental difference between the input terminals of the amplifier produces a corresponding difference in the voltage between the amplifier output terminals. Up to now, such so called "isolation amplifiers" have been almost universally used for such applications. Isolation amplifiers include "isolation barriers", such as isolation transformers, capacitive coupling, or optical coupling to provide "galvanic isolation" between the output terminal and the input terminals of the isolation amplifier, so that there is no DC path between the inputs and any output of the isolation amplifier. Unfortunately, isolation amplifiers are inherently expensive, because separate isolated power supplies are required for the input and output portions of the isolation amplifier on opposite sides of the isolation barrier. Isolation amplifiers are incapable of achieving nearly as good levels of gain accuracy, input offset voltage drift, linearity, and bandwidth as an amplifier not having a galvanic isolation barrier.

However, there appear to be many electronic applications for an amplifier in which a high degree of isolation between the amplifier inputs and outputs is needed, but pure galvanic isolation is unnecessary, as long as the amplifier can accept high common mode signals of ±200 volts operating on standard ±15 volt power supplies. However, up to now, no one as been able to design such an amplifier perhaps because integrated circuit designers traditionally avoid use of physically large integrated circuit resistors. Very large voltages applied across resistors result in increased power dissipation (which is proportional to the square of the voltage applied across a resistor). Substantial circuit design problems, including increased noise, large distributed capacitance associated with the resistors resulting in poor AC performance, poor common mode rejection that would be expected from difficulties in precisely matching physically large resistors, and serious thermal matching problems all probably have led those skilled in the art to avoid attempts to produce an integrated circuit difference amplifier that might be useable in many applications rather than an isolation amplifier.

SUMMARY OF THE INVENTION

Accordingly, it is an object of the invention to provide a technique for minimizing phase shift of a signal flowing through a physically large integrated circuit resistor with large associated distributed parasitic capacitance.

It is another object of the invention to provide an integrated circuit amplifier with a very large feedback resistor, but also having highly stable circuit performance, with substantially no signal overshoot or substantial oscillation in its pulse response.

It is another object of the invention to provide an integrated circuit difference amplifier that avoids use of a galvanic isolation barrier but nevertheless achieves high common mode rejection, extremely good linearity, high frequency response, and excellent common mode rejection for input common mode voltages of up to about ±200 volts while operating on a single, much lower power supply voltage of no more than about ±15 volts or equivalent voltage.

Briefly described, and in accordance with one embodiment thereof, the invention provides a technique for reducing or avoiding phase shift produced by distributed capacitance in a large sized thin film resistor in an integrated circuit by applying a signal both to a first terminal of the resistor and also to a terminal of an underlying diffused region, which is comprised of a doped material region having substantially lower resistance than the diffused resistor. An opposite end of the epitaxial region is connected to a ground or reference voltage conductor. The opposite end of the thin film resistor is connected to a receiving circuit such that equal voltage gradients occur in the thin film resistor and in the underlying epitaxial region. Since the voltage gradients are equal, essentially no incremental charging currents flow through the distributed capacitance between the thin film resistor and the epitaxial layer, and consequently essentially no phase shift occurs in the signal flowing through the thin film resistor. In one described embodiment of the invention, the thin film resistor is a uniform serpentine structure having a sheet resistance of 300 ohms per square and the epitaxial layer has an elongated rectangular shape with a sheet resistance of 5000 ohms per square. The thin film resistor functions as the feedback resistor in an isolating differential amplifier including an operational amplifier having its output connected to one terminal of the thin film resistor, and the inverting input connected to the other terminal of the thin film resistor. The inverting input of the operational amplifier is connected by a large input resistor to the inverting input of the isolating differential amplifier. A second input resistor is connected between a non-inverting input of the differential amplifier and a non-inverting input of the operational amplifier. A first voltage division resistor is coupled between the inverting input of the operational amplifier and the ground reference voltage. A second voltage division resistor is connected between the non-inverting input of the operational amplifier and the ground reference voltage. The input resistances, which are several hundred kilohms, in combination with the voltage division resistors, form a voltage division circuit that divides large common mode input voltages of the differential amplifier down to much smaller common mode input voltages that are applied to the inputs of the operational amplifier. The operational amplifier operates from power supplies much smaller in magnitude than the common mode voltages. The large input resistances and large feedback resistance effectively isolate the differential amplifier output from its inputs.

BRIEF DESCRIPTION OF THE DRAWINGS

FIGS. 4A, 4B, 4C and 4D constitute a sequence of diagrams showing pulse responses of the circuits of FIGS. 3A-3D, respectively.

BRIEF DESCRIPTION OF THE PREFERRED EMBODIMENTS

Figure 1:
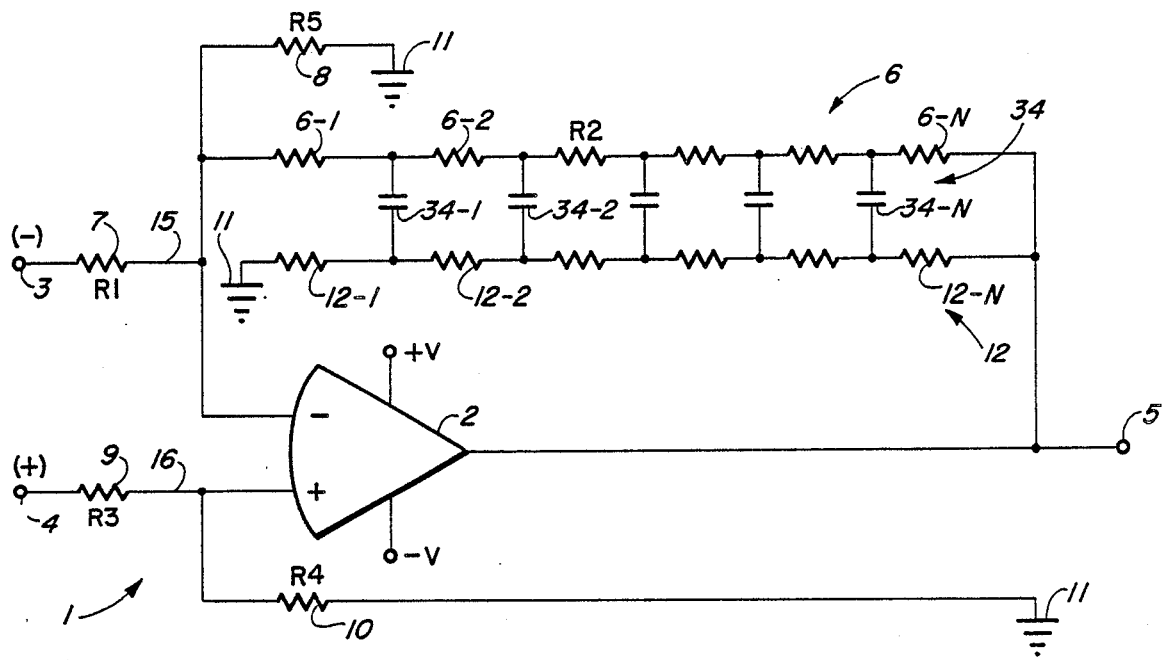
FIG. 1 is a schematic circuit diagram of a high common mode voltage difference amplifier.

Referring now to FIG. 1, reference numeral 1 designates a precision high common-mode voltage unity-gain isolating differential amplifier implemented in an integrated circuit. Differential amplifier 1 includes a suitable state-of-the-art integrated circuit operational amplifier circuit 2 having its output connected to output conductor 5, its inverting input connected to conductor 15, and its non-inverting input connected to conductor 16. Operational amplifier circuit 2 can be any of a variety of integrated circuit operational amplifier circuits which operate with typical power supply voltages of ±15 volts.

Conductor 16 is connected by a thin film nichrome resistor 10 to ground conductor 11. Conductor 16 also is connected by thin film resistor 9 t the non-inverting input 4 of the isolating difference amplifier 1. Input resistor 7 is coupled between the inverting input 15 of operational amplifier 2 and inverting input 3 of isolating difference amplifier 1.

Another nichrome thin film resistor 8 is connected between conductor 15 and ground conductor 11. A feedback resistor generally designated by reference numeral 6 is connected between output conductor 5 and inverting input 15 of operational amplifier 2. Reference numerals 6-1, 6-2 . . . 6-N designate N hypothetical sections of feedback resistor 6, which also is a thin film nichrome resistor. Feedback resistor 6 is not physically broken into N sections, but it is helpful to depict feedback resistor 6 in this fashion to illustrate the distributed nature of the capacitance between thin film feedback resistor 6 and the doped N-type underlying epitaxial layer or region 12.)

In accordance with the present invention, the N-type epitaxial layer 12 has one end connected to output conductor 5 adjacent to a corresponding end of nichrome feedback resistor 6. The opposite end of the epitaxial layer 12 is connected to ground conductor 11. The epitaxial layer 12 is schematically represented in FIG. 1 by N hypothetical series resistors 12-1, 12-2, 12-N. Capacitors 34-1 . . . 34-N are connected between equal proportions o sections of nichrome feedback resistor 6 and epitaxial layer 12 to illustrate the distributed nature of the parasitic capacitance 34 between thin film resistor 6 and the underlying epitaxial layer 12.

The isolating differential amplifier 1 is implemented in the Assignees INA117 Precision High Common-Mode Voltage Unity-Hain Differential Amplifier, which has been recently introduced to the market. In that product, the resistors have the values indicated in the following table:

TABLE 1

| RESISTOR | RESISTANCE (Kilohms) |
|---|---|
| 6 | R2 = 380 |
| 7 | R1 = 380 |
| 8 | R5 = 21.11 |
| 9 | R3 = 380 |
| 10 | R4 = 20 |

With the above indicated resistor values, the circuit of FIG. 1 is an isolating difference amplifier with a divide-by-20 input attenuator network and multiply-by-20 gain for the operational amplifier 2, with its associated feedback resistor R2 and input resistor R1. Since the input attenuator circuit divides down a common mode input signal applied to input conductors 3 and 4 by a factor of 20, a 200 volt common mode signal appearing on input conductors 3 and 4 appears as a 10 volt common mode signal on conductors 15 and 16. An AC input signal on conductor 4 is attenuated by a factor of 20 when it reaches conductor 15, and then is re-amplified by a factor of 20 by amplifier 2 and its feedback resistor 6. An AC input signal on conductor 3 is inverted by the amplifier 2. By superposition, the differential input signal between conductors 3 and 4 is then effectively multiplied by unity gain by the entire circuit of FIG. 1.

It can be seen that the input resistance of isolating differential amplifier 1 is 400 kilohms. This results in internal quiescent power dissipation of about 200 milliwatts if the amplitude of the common mode input voltage is 200 volts. Measured noise is equivalent to 0.01% of the full scale (10 volt) input signal, which is an acceptable value.

Distributed capacitance in the 380 kilohm feedback resistor 6 forms a phase shift network. Because of the unusually large resistance of feedback resistor 6, some way of reducing the phase shift was required to guarantee loop stability. To this end, first, the distributed capacitance 34 was minimized by eliminating laser trim tabs from resistor 6, so that the large trim tabs with their distributed capacitance would be on the less critical resistor 7 rather than on feedback resistor 6. Thin film nichrome feedback resistor 6 was formed nn an oxide of the carefully sized epitaxial N-type tub that underlies feedback resistor 6 and forms an epitaxial resistor 12 having a resistance of about 20 kilohms.

Figure 2A:
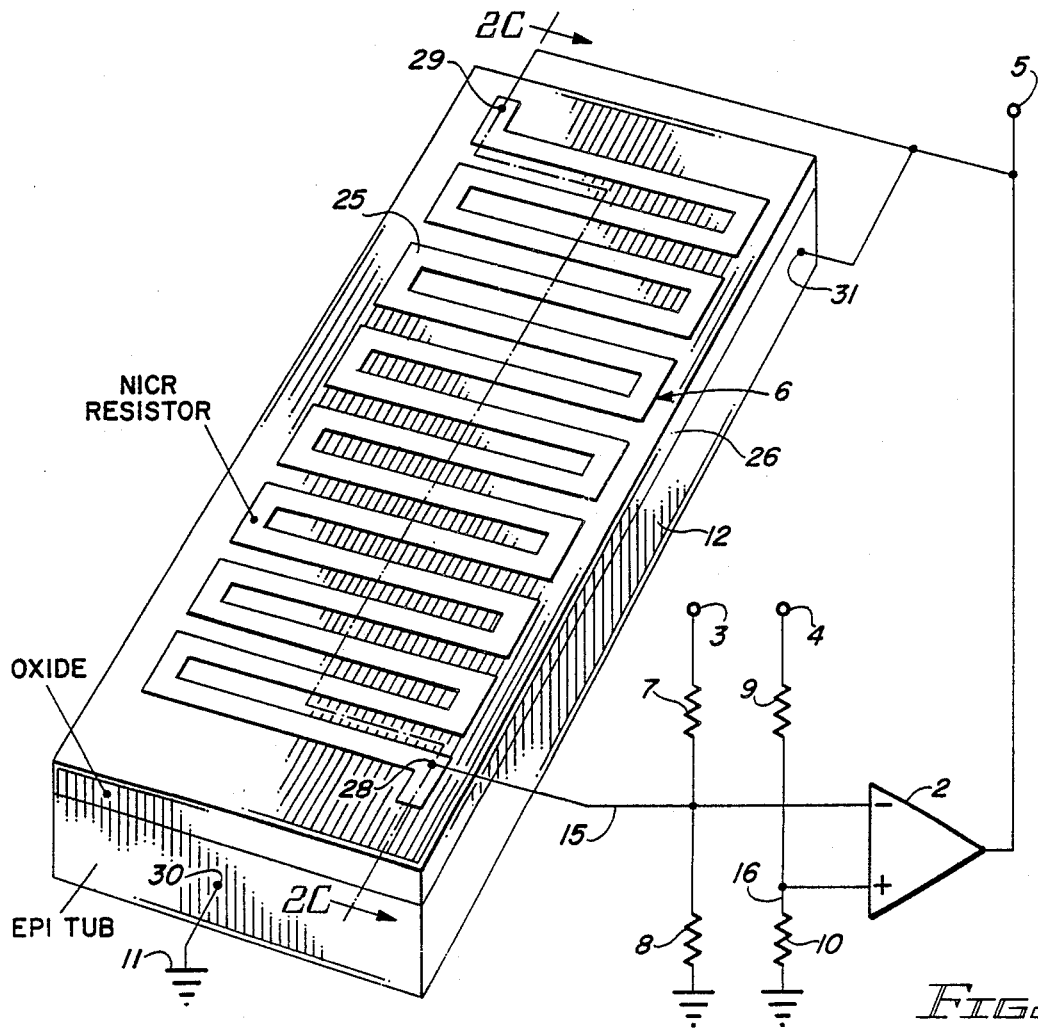
FIG. 2A is a partial perspective/schematic view of a thin film feedback resistor with one end of the feedback resistor and the underlying epitaxial tub driven by the same signal and an opposite end of the epitaxial tub being connected to a ground voltage.

Next, it will be convenient to refer to FIG. 2A, which shows a serpentine structure for nichrome thin film resistor 6 formed on field oxide layer 26, which is formed on N-type epitaxial tub region 12 in an ordinary bipolar integrated circuit structure. (For ease of illustration, the usual P+ isolation regions and underlying P type substrate are not shown.)

The parasitic capacitance 34 shown in FIG. 1 is formed by nichrome resistor 6 serving as a top plate of the distributed parasitic capacitance 34; the epitaxial region 12 acts as the lower plate. In accordance with the present invention, the serpentine configuration of the nichrome resistor 6 is uniform and repetitive. The shape of the epitaxial region 12 is rectangular. One end of the serpentine nichrome feedback resistor 6 is connected by electrical contact 29 to output conductor 5 of the operational amplifier 2. Output conductor 5 also is directly connected by contact 31 to the epitaxial tub 12. (Of course, and in accordance with good contact design, the connection 31 ordinarily would be made by aluminum metal passing through a suitable elongated contact opening in the top surface of oxide layer 26, rather than a spot connection as illustrated in FIG. 2A.)

The opposite end of the nichrome feedback resistor 6 is connected by aluminum metalization (conductor 15) making a contact represented by dot 28 to conductor 15. The opposite (front) end of epitaxial tub 12 is connected by a suitable contact 30 to ground conductor 11. (Of course, contact 30 represents a properly designed contact in which aluminum metalization extends through a suitable elongated contact hole in the oxide layer 26 to electrically contact to the epitaxial layer 12.)

With the above described design of nichrome feedback resistor 6 and epitaxial resistor tub 12, and with conductor 15 connected, in effect, to a virtual ground, the output voltage on conductor 5 divides uniformly across the equal hypothetical resistors 6-1, 6-2, etc., of nichrome resistor 6 and also across the equal hypothetical resistors 12-1, 12-2, etc., of epitaxial layer 12 as output current flows from conductor 5 through feedback resistor 6 to conductor 15, and also flows simultaneously through epitaxial resistor 12 to ground conductor 11. As a result, the voltage gradients from front to rear in thin film resistor 6 and epitaxial layer 12 are equal, so the differential voltage across each of the hypothetical distributed capacitances 34-1 . . . 34-N is zero, and consequently the current i charging each of those distributed capacitances also is zero.

Thus, in accordance with the present invention, the charging currents of the distributed capacitances are zero. Therefore, the feedback resistor and its associated parasitic capacitance does not cause a phase shift of the portion of the output signal on conductor 5 that is fed back to the virtual ground at inverting input 15 of the operational amplifier 2.

It should be noted that parasitic capacitance between n-type epitaxial region 12 and the p-type substrate (not shown) is negligible due to the low value of of resistance of region 12.

Figure 2B:
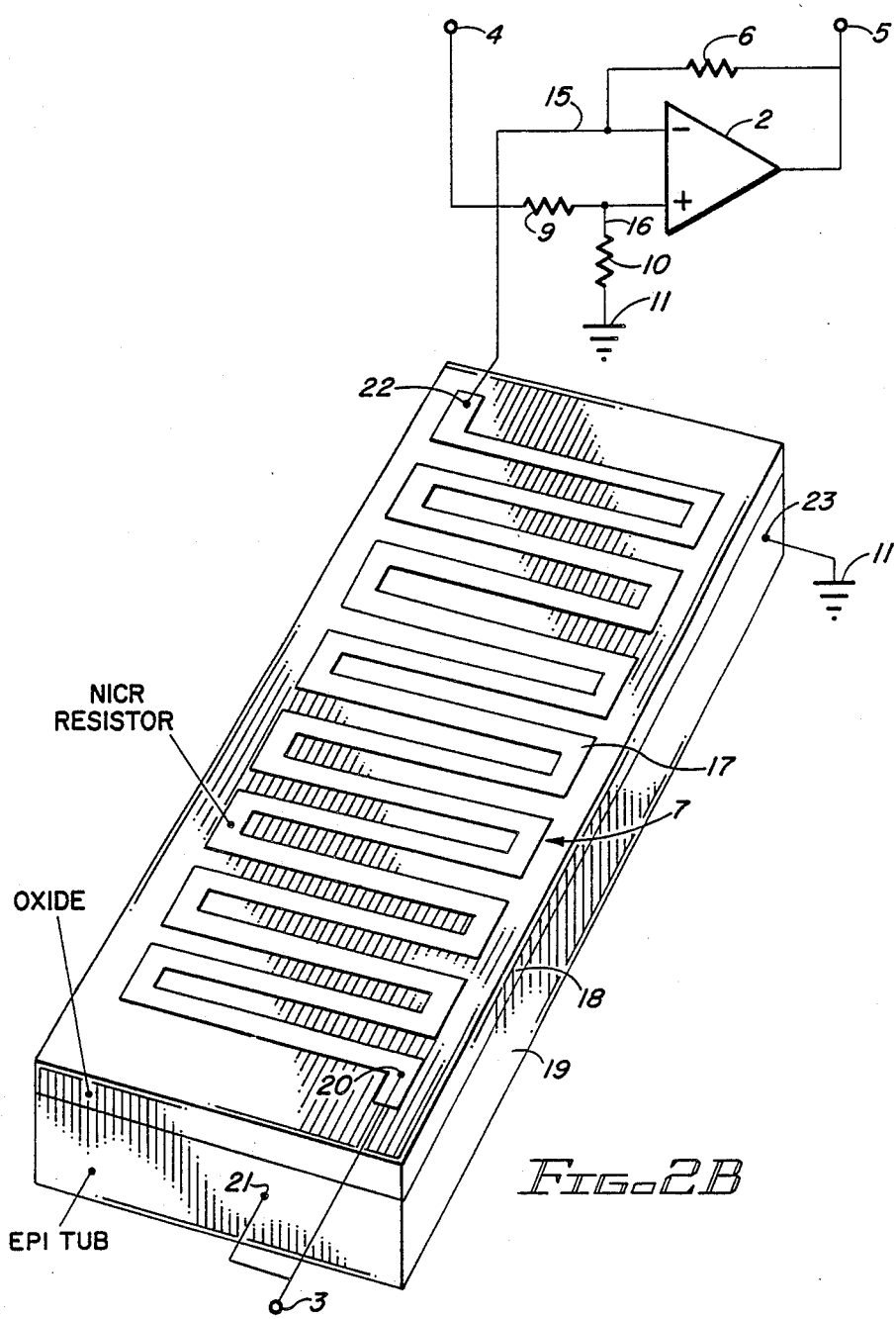
FIG. 2B is a partial perspective/schematic view of a thin film input resistor with one end of the input resistor and the underlying epitaxial tub driven by an input signal, the opposite end of the epitaxial tub being connected to ground.
Figure 2C:
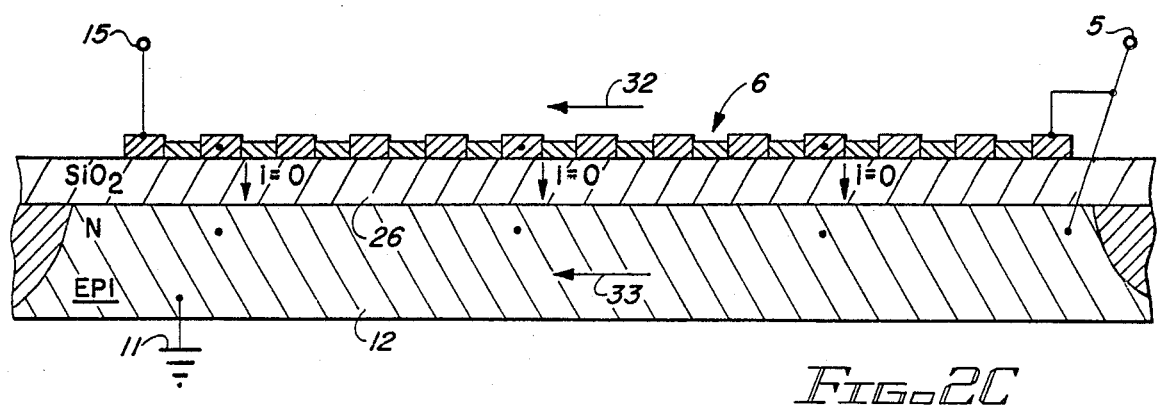
FIG. 2C is a section view across section line 2A—2A of FIG. 2A.

FIG. 2C, which is a section view along section line 2C—2C of FIG. 2A, shows the flow of current in the direction of arrow 32 from conductor 5 through nichrome feedback resistor 6 to inverting input conductor 15, and also shows the simultaneous flow through epitaxial resistor 12 in the direction of arrow 33 from operational amplifier output conductor 5 to ground conductor 11. FIG. 2C also indicates that the above-mentioned incremental distributed capacitance charging currents i are equal to zero.

FIG. 2B simply shows an alternate/additional utilization of the essentially same large thin film resistor structure described above, which can be used for the input resistor 7, if desired.

Figure 3A:
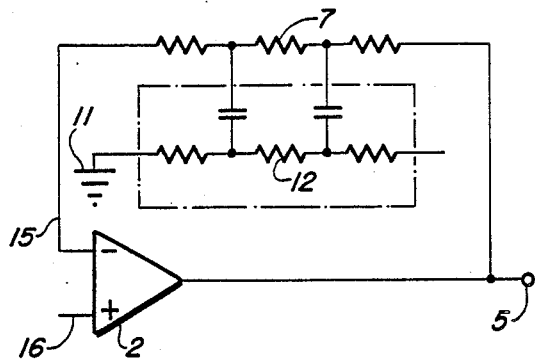
FIGS. 3A, 3B, 3C and 4D constitute a progression of alternative circuit connections which are useful in explaining advantages of the present invention.
Figure 3B:
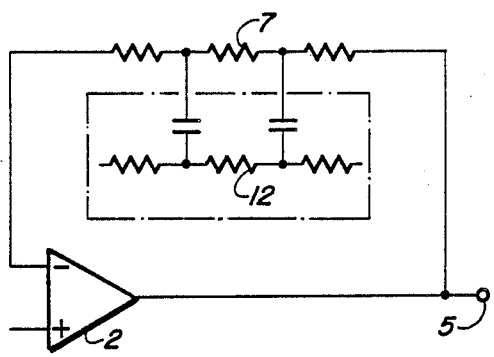
Figure 3C:
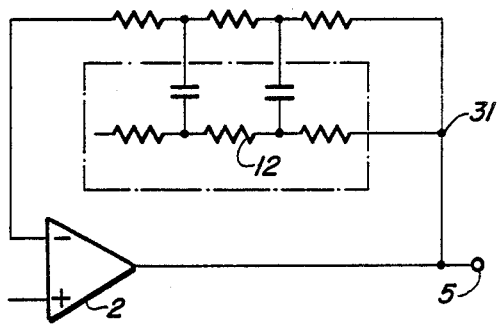
Figure 3D:
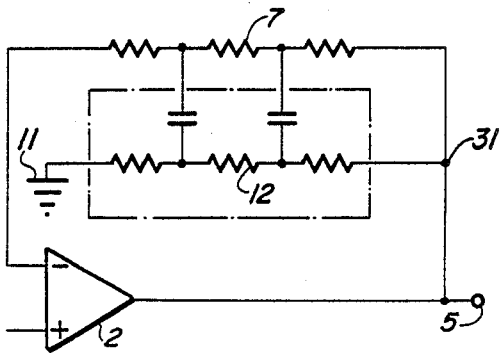
Figure 4A:
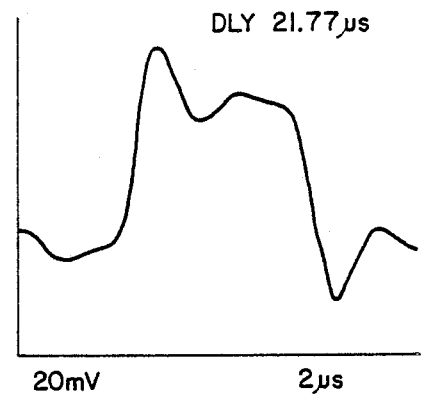

FIGS. 3A-D and FIGS. 4A-D illustrate the advantage of using the above described technique. FIG. 3A shows the connection of the circuit in FIG. 2A in which the connection 31 of epitaxial layer 12 to output conductor 5 is omitted. FIG. 4A shows the output voltage on conductor 5 in response to a 100 millivolt input pulse of 10 microsecond duration. A large overshoot and undershoot, each followed by damped oscillation, appears in the output waveform. This overshoot is unacceptable because of the resulting long signal settling time.

Figure 4B:
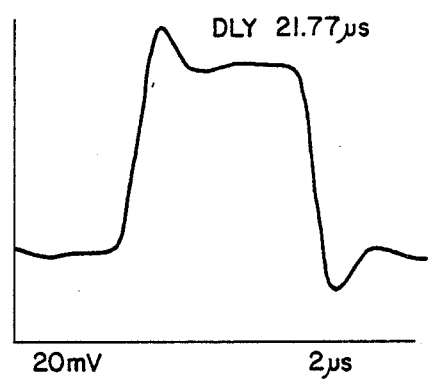

Next, in FIG. 3B, both ends of the epitaxial layer 12 is disconnected from output conductor 5 and ground conductor 11, respectively. The pulse response of the circuit of FIG. 3B (the above pulse) is shown in FIG. 4B, wherein it is seen that the amplitudes of the overshoot and undershoot and the subsequent "ringing" are reduced.

Figure 4C:
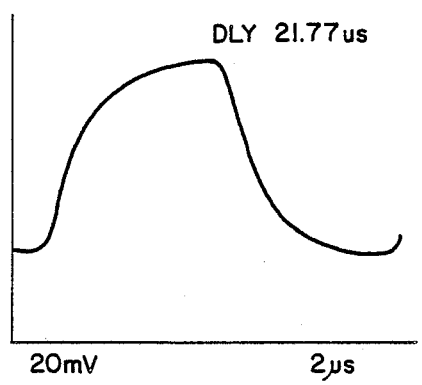

Next, in FIG. 3C, the right hand end of epitaxial layer is connected at 31 to output conductor 5. The left hand end of epitaxial layer 12 is left unconnected. The corresponding pulse response is shown in FIG. 4C, where a great deal of rounding or filtering of both the leading and trailing edges of the output response are noted.

Figure 4D:
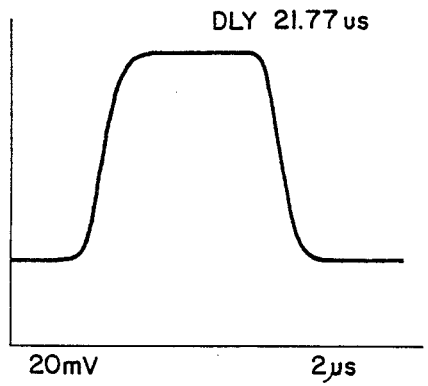

Finally, in FIG. 3D, the opposite ends of the epitaxial layer 12 are connected in the manner shown in FIG. 2A. The corresponding pulse response is shown in FIG. 4D. In FIG. 4D, an output pulse which is an almost perfect replica of the input pulse is shown. The output pulse of FIG. 4D is a dramatic improvement over the waveforms of FIGS. 4A, 4B, and 4C.

The above described circuit performance shows that the circuit of FIG. 2A, with its high resistance, large nichrome resistors compensated for by the above described techniques of making connections to opposite ends of the underlying epitaxial layer 12, produces a precision high common mode voltage, unity-gain, isolating differential amplifier that can be used in many applications where very high common mode rejection of common mode input voltages of ±200 volts or even more may be utilized if perfect galvanic isolation is not required. There are numerous applications where the precision of this circuit is highly desirable. The circuit then can be utilized without an isolated "ront-end" power supply, for example in battery cell monitor circuits, bridge amplifier load current monitors, leakage current test monitor circuits.

The circuit of FIG. 1,2A is ideally suited to solve voltage level translation problems in many circuit applications. Neither common mode nor difference signals up to ±500 volts DC will damage the circuit of FIG. 2A. The circuit has the capability of providing nearly ten times the accuracy of an isolation amplifier at 1/5 to 1/10 of the cost in applications where perfect galvanic isolation is not required.

In physically implementing the isolating differential amplifier of FIG. 2A on a monolithic integrated circuit chip, the problems of physically matching and symmetrically placing the five resistors presented a formidable challenge, which was solved by dividing the 20 kilohm resistor R4 into two parallel sections of 21.111 kilohms and 380 kilohms. With a 380 kilohm part of the resistor R1 matched to the 380 kilohm feedback resistor R2 and the 21.111 kilohm portion matched to the other 21.111 kilohm resistor R5, nearly perfect symmetry was achieved. Resistors were symmetrically placed on the chip to achieve uniform thermal balance therein.

While the invention has been described with reference to a particular embodiment thereof, those skilled in the art will be able to make various modifications to the described embodiment without departing from the true spirit and scope of the invention. For example, the region 12 could be an ion implanted resistor, or it could be a thin film resistor in a multilayer structure. Also, the top resistor 6 could be a diffused resistor in a different type of multilayer structure having silicon, rather than insulator on top.

What is claimed is:

1. A method of reducing the effects of distributed parasitic capacitance on a signal passing through a first resistor disposed on a first surface of an insulating layer, comprising the steps of:
   (a) applying the signal to a first terminal of the first resistor and a first terminal of a second resistor disposed along a second surface of the insulating layer, the first resistor overlapping the second resistor so there exists a distributed parasitic capacitance between the first and second resistors;
   (b) maintaining a second terminal of the first resistor at approximately a ground voltage, thereby causing a first current to flow through the first resistor in response to the signal;
   (c) maintaining a second terminal of the second resistor at a ground voltage thereby causing a second current to flow through the second resistor in response to the signal, the first current producing a first voltage gradient in the first resistor, the second current producing a second voltage gradient in the second resistor, the first and second voltage gradients being sufficiently nearly equal to prevent substantial charging currents from flowing through the parasitic capacitance, whereby the signal undergoes reduced phase shift as it passes through the first resistor.

2. The method of claim 1 wherein the circuit includes an operational amplifier, step (a) includes producing the signal at an output of the operational amplifier, and step (b) includes maintaining the voltage of the second terminal of the first resistor at a voltage of an inverting input of the operational 3. The method of claim 2 including applying an input signal across a third resistor connected to the inverting input of the operational amplifier.

4. The method of claim 3 wherein the first resistor is a serpentine thin film resistor formed on the insulating layer and wherein the second resistor includes an electrically isolated epitaxial layer on which the insulative layer is disposed, the method including causing the first current to flow through serpentine path.

5. The method of claim 4 including causing the second current to flow in a generally straight path directly beneath the thin film resistor, wherein the resistance of the thin film resistor is substantially greater than the resistance of the epitaxial layer, whereby the first and second voltage gradients are approximately equal.

6. In an integrated circuit resistor structure including an isolated doped layer, an insulative layer on the epitaxial layer, and a high resistance thin film resistor on the insulative layer, means for reducing phase shift of a signal flowing through the thin film resistor, the phase shift reducing means comprising in combination:
   (a) first means for applying an AC reference voltage to a first terminal of the thin film resistor;
   (b) second means for applying a DC reference voltage to a first part of the isolated doped layer;
   (c) third means for applying a first signal to both a second terminal of the thin film resistor and a second part of the isolated doped layer to thereby cause a first current to flow through the thin film resistor and produce a first voltage gradient therein and to also cause a second current to flow through the isolated doped layer and produce a second voltage gradient therein, the first and second voltage gradients being sufficiently nearly equal to prevent substantial charging currents from flowing through parasitic capacitance between the thin film resistor and the isolated doped layer, whereby effects of distributed parasitic capacitance on the first current as it flows through the thin film resistor are substantially avoided.

7. The phase shift reducing means of claim 6 wherein the thin film resistor has a symmetrical serpentine pattern.

8. The phase shift reducing means of claim 7 wherein the isolated doped layer is generally rectangular, the first and second parts being disposed on opposite ends thereof adjacent to the first and second terminals, respectively, of the thin film resistor.

9. The phase shift reducing means of claim 8 wherein the isolated doped layer is N-type and the thin film resistor is composed of nichrome.

10. The phase shift reducing means of claim 9 wherein the first and second means are included in an operational amplifier having an output connected to the first terminal of the thin film resistor and the first part of the epitaxial region and an inverting input connected to a second terminal of the thin film resistor, and means for applying a ground voltage to a non-inverting input of the operational amplifier.

11. An isolating differential amplifier comprising in combination:
   (a) a first inverting input, a second non-inverting input, a first output;
   (b) an amplifier circuit having a second inverting input, a second non-inverting input, and an output coupled to the first output, and first and second supply voltage terminals, and a reference voltage conductor;
   (c) an electrically isolated doped layer;
   (d) an insulative layer on the isolated doped layer;
   (e) a high resistance thin film resistor on the insulative layer having a first terminal coupled to the first output and a second terminal coupled to the second non-inverting input;
   (f) a first input resistor coupled between the first and second non-inverting inputs;
   (g) a first voltage division resistor coupled between the reference voltage conductor and the second non-inverting input;
   (h) means for reducing phase shift of a signal flowing through the thin film resistor, the phase shift reducing means including:
      (i) first means for applying an AC reference voltage to the second terminal of the thin film resistor;

(ii) second means for applying a reference voltage on the reference voltage conductor to a first part of the isolated doped layer;

(iii) third means for applying a first signal produced on the first output to both the first terminal of the thin film resistor and a second part of the epitaxial layer to thereby cause a first current to flow through the thin film resistor and produce a first voltage gradient therein and to also cause a second current to flow through the epitaxial layer and produce a second voltage gradient therein, the first and second voltage gradients being sufficiently nearly equal to prevent substantial charging currents from flowing through parasitic capacitance between the thin film resistor and the epitaxial layer, whereby phase shift of the first current as it flows through the thin film resistor is substantially avoided.

* * * * *